United States Patent
Saito

(10) Patent No.: US 8,120,517 B2
(45) Date of Patent: Feb. 21, 2012

(54) DIGITAL-ANALOG CONVERSION CIRCUIT AND OUTPUT DATA CORRECTION METHOD OF THE SAME

(75) Inventor: Wataru Saito, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 31 days.

(21) Appl. No.: 12/585,380

(22) Filed: Sep. 14, 2009

(65) Prior Publication Data

US 2010/0090874 A1 Apr. 15, 2010

(30) Foreign Application Priority Data

Oct. 10, 2008 (JP) .................. 2008-263698

(51) Int. Cl.
*H03M 1/10* (2006.01)
(52) U.S. Cl. ........ 341/118; 341/120; 341/121; 341/143; 341/144
(58) Field of Classification Search .................. 341/118, 341/129, 143, 144, 120
See application file for complete search history.

(56) References Cited

U.S. PATENT DOCUMENTS

| | | | |
|---|---|---|---|
| 6,624,772 B1 * | 9/2003 | Gealow et al. ................ | 341/120 |
| 6,888,481 B2 * | 5/2005 | Itoh ................................ | 341/118 |
| 7,068,193 B2 * | 6/2006 | Dempsey et al. .............. | 341/120 |
| 7,199,743 B2 * | 4/2007 | Casper et al. .................. | 341/150 |
| 7,362,247 B2 * | 4/2008 | Arias et al. ..................... | 341/120 |
| 7,423,558 B2 | 9/2008 | Ueno | |
| 7,609,184 B2 * | 10/2009 | Kuramochi et al. .......... | 341/118 |
| 7,804,433 B1 * | 9/2010 | Haroun et al. ................. | 341/120 |
| 2006/0007029 A1 * | 1/2006 | Ito .................................. | 341/144 |
| 2006/0125669 A1 * | 6/2006 | Dempsey et al. .............. | 341/144 |
| 2007/0115158 A1 * | 5/2007 | Zoso et al. ..................... | 341/143 |
| 2007/0216559 A1 | 9/2007 | Ueno | |
| 2008/0238739 A1 * | 10/2008 | Chung et al. .................. | 341/120 |
| 2008/0266153 A1 * | 10/2008 | Rychen .......................... | 341/120 |
| 2009/0121907 A1 * | 5/2009 | Kuramochi et al. .......... | 341/120 |

FOREIGN PATENT DOCUMENTS

| | | |
|---|---|---|
| JP | 63-42523 | 2/1988 |
| JP | 2007-235379 | 9/2007 |

* cited by examiner

*Primary Examiner* — Linh Nguyen
(74) *Attorney, Agent, or Firm* — McGinn Intellectual Property Law Group, PLLC

(57) ABSTRACT

A digital-analog conversion circuit includes a correction unit that adds a correction bit to a lower-order bit of externally input first digital input data and outputs second digital input data, and a conversion unit that receives the second digital input data and outputs an analog value, and the correction unit generates the second digital input data by manipulating data of a lower-order bit of the second digital input data around a point at which an error between the analog value and an expected value set for the first digital input data becomes larger than a preset value.

19 Claims, 8 Drawing Sheets

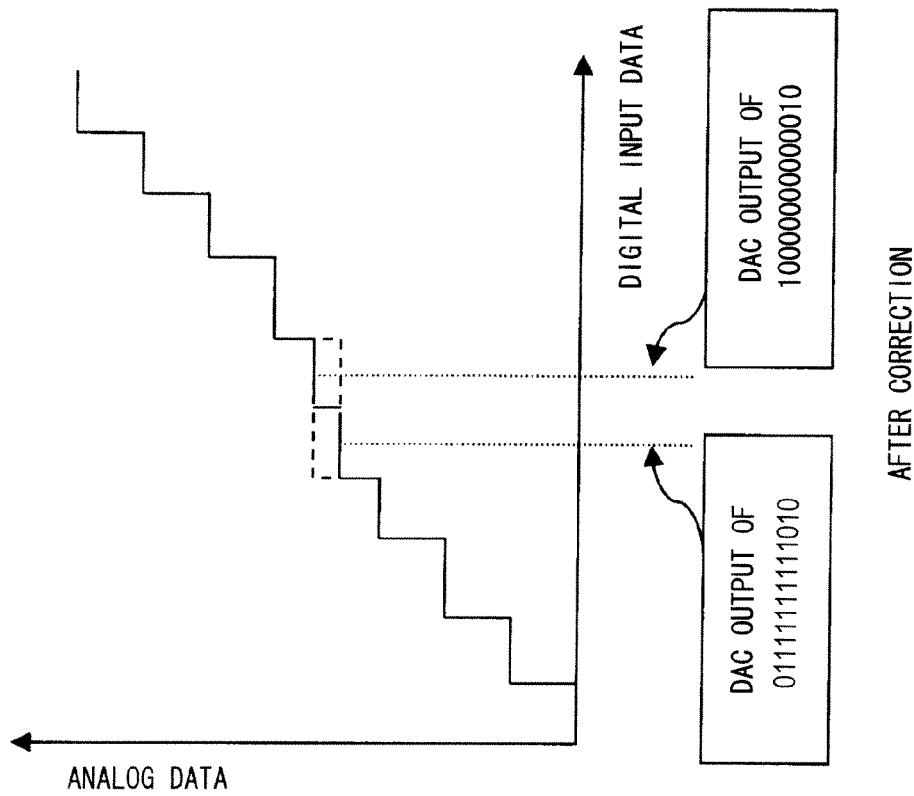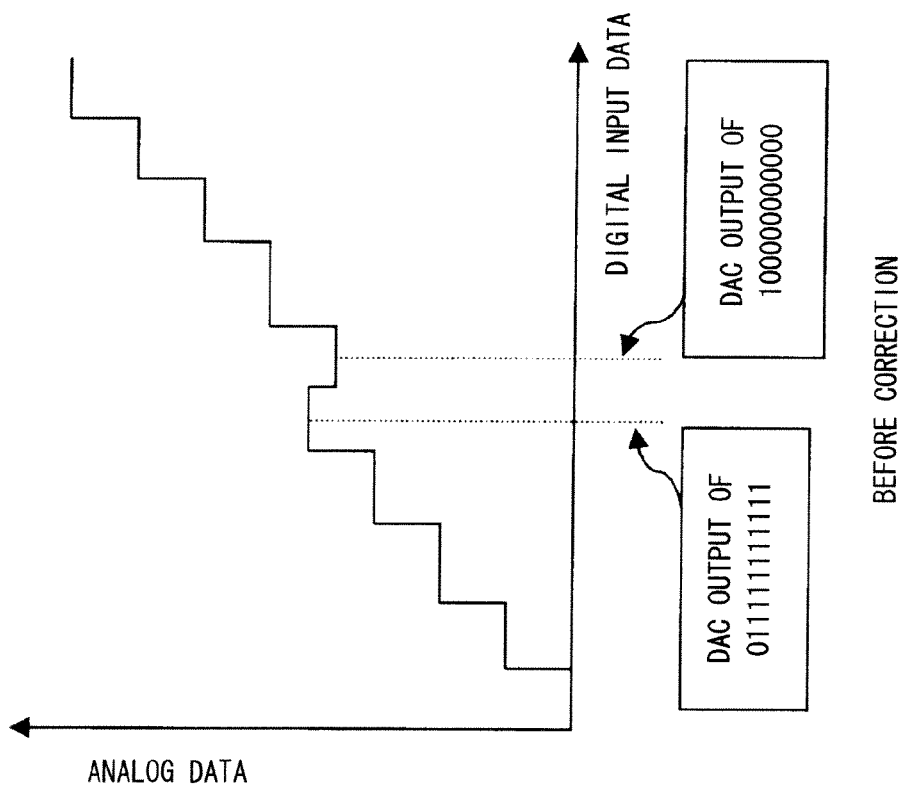

DIGITAL-ANALOG CONVERSION CIRCUIT AND OUTPUT DATA CORRECTION METHOD OF THE SAME

BACKGROUND

1. Field of the Invention

The present invention relates to a digital-analog conversion circuit and its output data correction method and, particularly, to a digital-analog conversion circuit including a correction unit that makes correction to digital input data.

2. Description of Related Art

In recent electronic equipment, conversion of digital data into an analog signal is widely used to control various kinds of equipment based on digital data obtained as a result of performing digital processing. A digital-analog conversion circuit (DAC) is a circuit that converts digital data into an analog signal. FIG. 7 shows an example of the digital-analog conversion circuit.

A digital-analog conversion circuit 100 shown in FIG. 7 is a cyclic digital-analog conversion circuit, which is an example of the digital-analog conversion circuit. The cyclic digital-analog conversion circuit 100 includes an amplifier AMP, capacitors C1 to C3, and a plurality of switches. When a digital input signal b(n) is High level (b(n)=1), the switch S1 is ON, and digital input data Vref is input to the digital-analog conversion circuit 100. On the other hand, when the digital input signal b(n) is Low level (b(n)=0), the switch S2 is ON, and input of the digital-analog conversion circuit 100 is connected to the ground. The capacitor C1 receives digital input data Vref*b(n) through a switch and is connected to the amplifier AMP through another switch. The capacitor C2 is connected between the input terminal and the output terminal of the amplifier AMP. The capacitor C3 is connected in parallel with the capacitor C2. Switches are connected at both ends of the capacitor C3, so that the capacitor C3 can be disconnected from the capacitor C2.

The cyclic digital-analog conversion circuit 100 receives digital input data as serial data. Then, the cyclic digital-analog conversion circuit 100 repeatedly performs sampling operation that samples the received data and integral operation of the sampled value with use of the circuit shown in FIG. 7, and thereby outputs an analog signal. The cyclic digital-analog conversion circuit 100 switches between the sampling operation and the integral operation according to control clocks $\phi1$ and $\phi2$. FIG. 8 shows a timing chart of the control clocks. As shown in FIG. 8, the control clocks $\phi1$ and $\phi2$ are generated based on an operating clock, and the control clock $\phi1$ is High level in the first half period of one conversion period and the control clock $\phi2$ is High level in the latter half period of the conversion period. The switch denoted by the symbol $\phi1$ in FIG. 7 has continuity during the High level period of the control clock $\phi1$, and the cyclic digital-analog conversion circuit 100 is in the sampling mode to perform the sampling operation. The switch denoted by the symbol $\phi2$ in FIG. 7 has continuity during the High level period of the control clock $\phi2$, and the cyclic digital-analog conversion circuit 100 is in the integral mode to perform the integral operation.

FIG. 9A is a circuit diagram of the cyclic digital-analog conversion circuit 100 in the sampling mode, and FIG. 9B shows is a circuit diagram of the cyclic digital-analog conversion circuit 100 in the integral mode. The operation of the cyclic digital-analog conversion circuit 100 is described hereinafter with reference to FIGS. 9A and 9B.

Referring to FIG. 9A, the capacitor C1 in the sampling mode is connected between an input terminal and a virtual ground point (e.g. a ground terminal). Further, in the sampling mode, the capacitor C1 is disconnected from the amplifier AMP. The capacitor C2 is connected between the inverting terminal and the output terminal of the amplifier AMP. The capacitor C3 is disconnected from the capacitor C2, and both terminals of the capacitor C3 are connected to the virtual ground point (e.g. a ground terminal). The charge capacitance of each capacitor on the basis of the virtual ground point in the sampling mode is as follows. Specifically, if the charge capacitance of the capacitor C1 is Q1$a$, the charge capacitance of the capacitor C2 is Q2$a$ and the charge capacitance of the capacitor C3 is Q3$a$, the charge capacitances Q1$a$ to Q3$a$ are represented by the following expressions (1) to (3). In the expressions (1) to (3), n indicates an operating period number.

$$Q1a = C1 \times (-Vref \times b(n)) \qquad (1)$$

$$Q2a = C2 \times (-Vout(n-1)) \qquad (2)$$

$$Q3a = 0 \qquad (3)$$

Referring then to FIG. 9B, the capacitor C1 in the integral mode is disconnected from the input terminal. The capacitor C1 is connected between the virtual ground point (e.g. a ground terminal) and the inverting terminal of the amplifier AMP. The capacitor C2 is connected between the inverting terminal and the output terminal of the amplifier AMP. The capacitor C3 is connected in parallel with the capacitor C2. The charge capacitance of each capacitor on the basis of the virtual ground point in the integral mode is as follows. Specifically, if the charge capacitance of the capacitor C1 is Q1$b$, the charge capacitance of the capacitor C2 is Q2$b$ and the charge capacitance of the capacitor C3 is Q3$b$, the charge capacitances Q1$b$ to Q3$b$ are represented by the following expressions (4) to (6). In the expressions (4) to (6), n indicates an operating period number.

$$Q1b = 0 \qquad (4)$$

$$Q2b = C2 \times (-Vout(n)) \qquad (5)$$

$$Q3b = C3 \times (-Vout(n)) \qquad (6)$$

The cyclic digital-analog conversion circuit 100 performs conversion operation by switching between the sampling mode and the integral mode at given intervals. The charge capacitance of each capacitor on the basis of the virtual ground point is equal in the sampling mode and in the integral mode. Therefore, the following expression (7) can be derived from the expressions (1) to (6).

$$-C1 \times (Vref \times b(n)) - C2 \times Vout(n-1) + 0 = 0 - C2 \times Vout(n) - C3 \times Vout(n) \qquad (7)$$

If an output analog value Vout(n) is calculated from the expression (7), the analog value Vout(n) is represented by the following expression (8).

$$Vout(n) = \frac{C2}{C2+C3} \times Vout(n-1) + \frac{C1}{C2+C3} \times (Vref \times b(n)) \qquad (8)$$

The expression (8) shows that the analog value Vout(n) that is output from the cyclic digital-analog conversion circuit 100 is determined by the capacitance ratio of the capacitors C1 to C3. In the cyclic digital-analog conversion circuit 100, the sampling mode and the integral mode correspond to one operating period, and the conversion operation of multi-bit digital input signal b(n) is performed by repeating the period. An analog value Vout(10) when the number of repetition n is 10 (i.e. the number of bits of the digital input signal b(n) is 10)

and the capacitances of the capacitors C1 to C3 are the same is represented by the following expression (9).

$$Vout(10) = \left(\frac{1}{2}\right)^1 \times (Vref \times b(10)) + \left(\frac{1}{2}\right)^2 \times (Vref \times b(9)) + \\ \left(\frac{1}{2}\right)^3 \times (Vref \times b(8)) + \left(\frac{1}{2}\right)^4 \times (Vref \times b(7)) + \\ \left(\frac{1}{2}\right)^5 \times (Vref \times b(6)) + \left(\frac{1}{2}\right)^6 \times (Vref \times b(5)) + \left(\frac{1}{2}\right)^7 \times (Vref \times b(4)) + \\ \left(\frac{1}{2}\right)^8 \times (Vref \times b(3)) + \left(\frac{1}{2}\right)^9 \times (Vref \times b(2)) + \left(\frac{1}{2}\right)^{10} \times (Vref \times b(1)) \quad (9)$$

The expression (9) shows that the cyclic digital-analog conversion circuit 100 can convert multi-bit digital input data according to the number of repetition.

As described above, in the cyclic digital-analog conversion circuit 100, an output result is affected by relative variation in the capacitances of the capacitors C1 to C3. Thus, an analog value Vout(n) when an ideal capacitance of the capacitors C1 to C3 is Cunit and the respective variations of the capacitors C1 to C3 are ΔC1 to ΔC3 is represented by the following expression (10).

$$Vout(n) = \frac{Cunit + \Delta C2}{2Cunit + \Delta C2 + \Delta C3} \times Vout(n-1) + \\ \frac{Cunit + \Delta C1}{2Cunit + \Delta C2 + \Delta C3} \times (Vref \times b(n)) \quad (10)$$

In the expression (10), if the variations ΔC1 to ΔC3 of the capacitors C1 to C3 have a different amount of variations, it is difficult to maintain the linearity between the first term and the second term of the expression (10), which causes degradation of the linearity of an output result. A technique for improving the linearity of an output result in a cyclic digital-analog conversion circuit is disclosed in Japanese Unexamined Patent Application Publications Nos. 63-42523 and 2007-235379, for example.

In an error detection and correction method of a cyclic digital-analog conversion circuit disclosed in Japanese Unexamined Patent Application Publication No. 63-42523, input data composed of two-valued binary code is converted into two multi-valued binary codes indicating the same value. Then, a difference in a result of digital-analog conversion on the respective input data or DNL (Differential Non-Linearity) characteristics is measured. Further, a capacitance error amount of the capacitor in the circuit is calculated, and the capacitance of the capacitor is tuned. The DNL characteristics are thereby improved in the cyclic digital-analog conversion circuit disclosed in Japanese Unexamined Patent Application Publication No. 63-42523.

In the technique disclosed in Japanese Unexamined Patent Application Publication No. 2007-235379, a capacitor is added to a cyclic digital-analog conversion circuit. Then, a switching method for the capacitor is altered, so that the capacitor to be used for charging is changed for each input bit. A plurality of capacitors are thereby used evenly in the cyclic digital-analog conversion circuit disclosed in Japanese Unexamined Patent Application Publication No. 2007-235379, thus dispersing the effect of the relative variation in the capacitances of the capacitors among bits. The effect of the relative variation in the capacitances of the capacitors is thereby reduced in the cyclic digital-analog conversion circuit disclosed in Japanese Unexamined Patent Application Publication No. 2007-235379.

SUMMARY

However, in the techniques disclosed in Japanese Unexamined Patent Application Publications Nos. 63-42523 and 2007-235379, it is necessary to add a capacitor for reducing the effect of the variation in the capacitances of the capacitors C1 to C3. The capacitor generally has a large occupation area. Thus, addition of the capacitor causes a significant increase in the circuit area of the digital-analog conversion circuit.

A first exemplary aspect of an embodiment of the present invention is a digital-analog conversion circuit which includes a correction unit that adds a correction bit to a lower-order bit of externally input first digital input data and outputs second digital input data, and a conversion unit that receives the second digital input data and outputs an analog value, wherein the correction unit generates the second digital input data by manipulating data of a lower-order bit of the second digital input data around a point where an error between the analog value and an expected value set for the first digital input data becomes larger than a preset value.

A second exemplary aspect of an embodiment of the present invention is an output data correction method in a digital-analog conversion circuit that converts first digital input data into analog output data, which includes calculating a correction amount based on an error between the analog output data and an expected value set for the first digital input data, generating second digital input data by adding a correction bit having a value based on the correction amount to a lower-order bit of the first digital input data, and converting the second digital input data and obtaining the analog output data.

In the digital-analog conversion circuit and the output data correction method thereof according to the exemplary aspects of an embodiment of the present invention described above, the second digital input data in which the correction bit is added to the first digital input data, which is a conversion source, is generated. Then, the bit containing the correction bit of the second digital input data is manipulated according to the correction amount of data, thereby correcting the digital input data. The digital-analog conversion circuit and the output data correction method thereof according to the exemplary aspects of an embodiment of the present invention can thereby correct the linearity of the analog value as output data without changing the configuration of the conversion unit.

In the digital-analog conversion circuit and the output data correction method thereof according to the exemplary aspects of an embodiment of the present invention described above, it is possible to correct the linearity of output data and suppress an increase in circuit area of a conversion unit.

BRIEF DESCRIPTION OF THE DRAWINGS

The above and other exemplary aspects, advantages and feature amounts will be more apparent from the following description of certain exemplary embodiments taken in conjunction with the accompanying drawings, in which:

FIGS. 5A and 5B are graphs showing an example of correction data calculated in a digital-analog conversion circuit according to an exemplary embodiment;

DETAILED DESCRIPTION OF THE EXEMPLARY EMBODIMENTS

Figure 1:
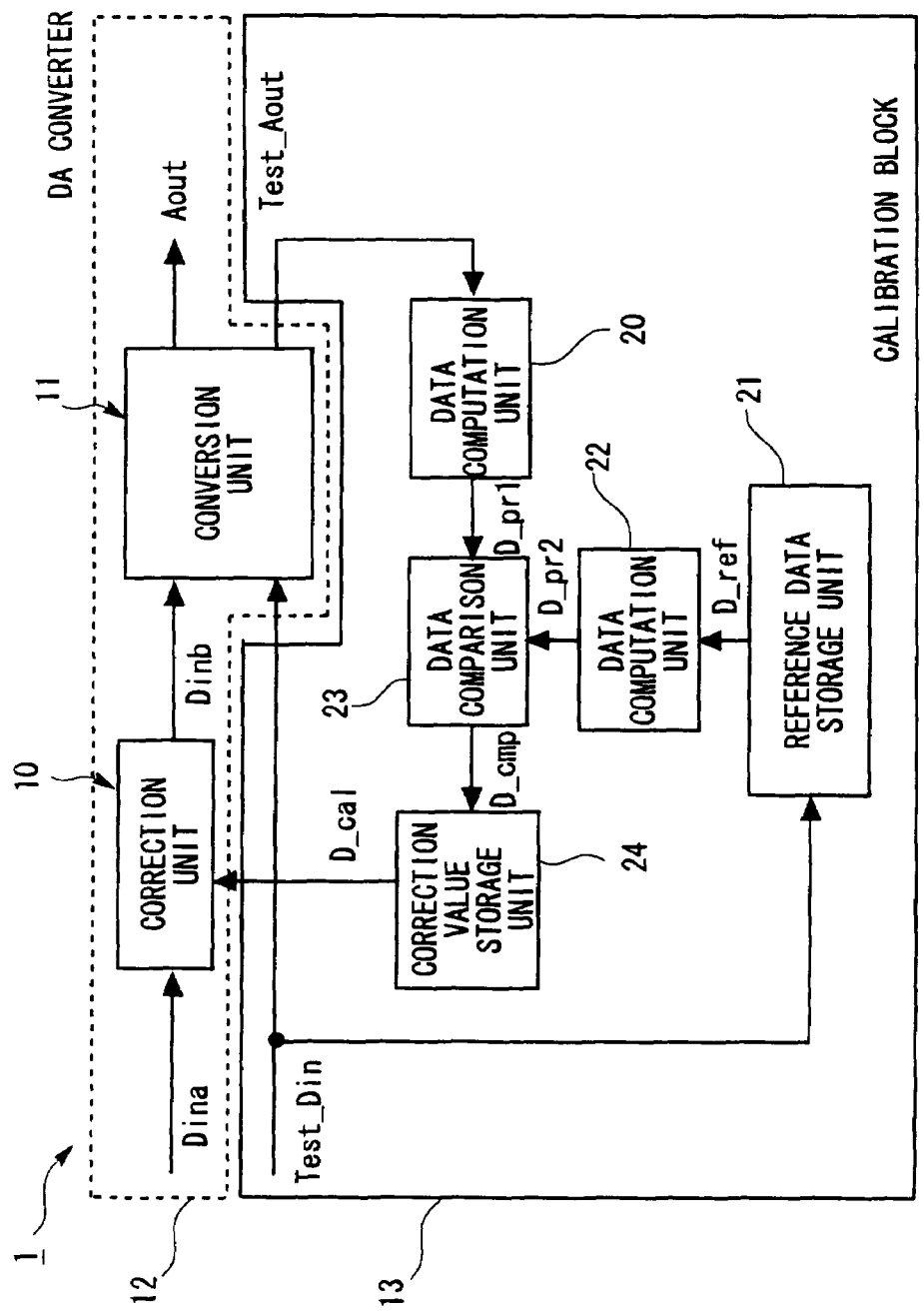
FIG. 1 is a block diagram of a digital-analog conversion circuit according to an exemplary embodiment.

An exemplary embodiment of the present invention is described hereinafter with reference to the drawings. FIG. 1 is a block diagram of a digital-analog conversion circuit (which is referred to hereinafter as a DAC) 1 according to an exemplary embodiment of the present invention. Referring to FIG. 1, the DAC 1 includes a DA converter 12 and a calibration block 13.

The DA converter 12 converts first digital input data Dina that is input as a digital signal into analog data Aout (having an analog value) and outputs it. The DA converter 12 includes a correction unit 10 and a conversion unit 11. The correction unit 10 adds a correction bit to the lower-order bit of the first digital input data Dina and outputs second digital input data Dinb. In this exemplary embodiment, the first digital input data Dina is 12-bit parallel data, the correction bit is 2 bits, and the second digital input data Dinb is 14-bit serial data. The second digital input data Dinb that is output from the correction unit 10 is data after making correction to the first digital input data Dina, and the correction unit 10 makes correction according to a control signal D_cal that is supplied from the calibration block 13. The control signal D_cal contains a correction direction designation signal and a correction bit signal. The correction unit 10 is described in detail later.

The conversion unit 11 converts the second digital input data Dinb that is output from the correction unit 10 into analog data Aout. In this exemplary embodiment, a cyclic digital-analog conversion circuit is used as the conversion unit 11. Thus, the conversion unit 11 receives an operating clock from a clock supply source, which is not shown, and outputs the analog data Aout at a given cycle. The operating clock has a frequency enough to convert the number of bits of the second digital input data Dinb. The DA converter 12 receives one first digital input data Dina and outputs analog data corresponding to the first digital input data Dina in one cycle.

The calibration block 13 determines a value of the control signal D_cal to be supplied to the correction unit 10 based on calibration operation. Specifically, the calibration block 13 determines a value of the control signal D_cal by comparing DNL characteristics of test output Test_Aout (analog value) that is output from the conversion unit 11 of the DA converter 12 in response to test digital input data Test_Din and ideal DNL characteristics that are preset corresponding to the test digital input data Test_Din.

The calibration block 13 includes a reference data storage unit 21, data computation units 20 and 22, a data comparison unit 23 and a correction value storage unit 24. The reference data storage unit 21 stores the input test digital input data Test_Din and outputs the stored value as reference data D_ref. The data computation unit 22 performs arithmetic computation on the reference data D_ref and outputs a reference feature amount D_pr2 (e.g. an ideal value of DNL characteristics). The data computation unit 20 performs arithmetic computation on the test output Test_Aout that is output from the conversion unit 11 and outputs an actual data feature amount D_pr1 (e.g. an actual measured value of DNL characteristics). The data comparison unit 23 compares the reference feature amount D_pr2 and the actual data feature amount D_pr1, calculates a correction value for the test digital input data based on an error between the ideal value and the actual measured value, and outputs the correction value as a comparison result signal D_cmp. The correction value storage unit 24 stores the correction value that is input as the comparison result signal D_cmp and outputs the control signal D_cal based on the stored correction value. In this exemplary embodiment, a 2-bit correction bit signal and a 1-bit correction direction designation signal are input to the correction unit 10 of the DA converter 12.

Figure 2:
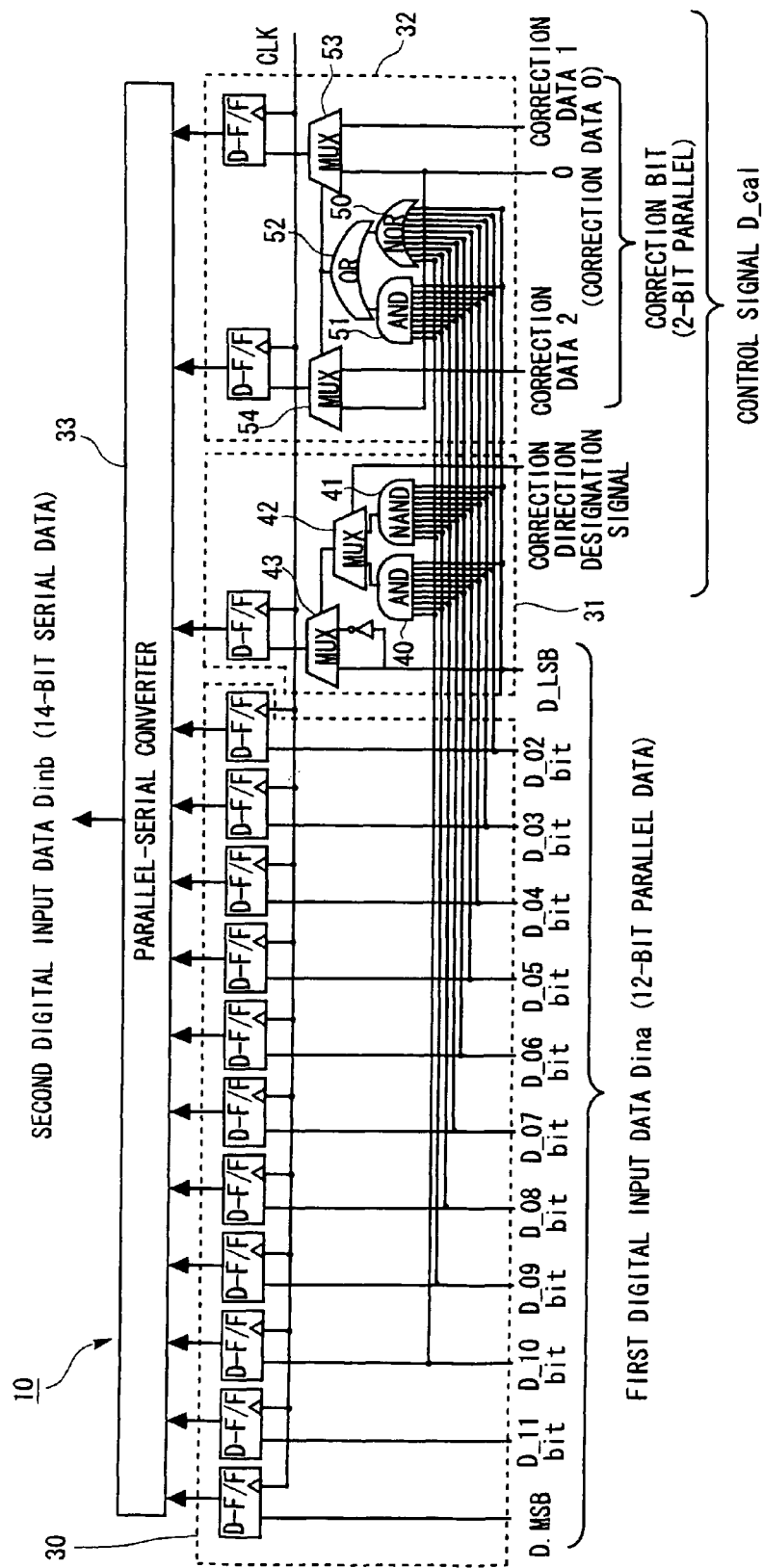
FIG. 2 is a block diagram of a correction unit of a digital-analog conversion circuit according to an exemplary embodiment.

The correction unit 10 according to the exemplary embodiment is described hereinafter in detail. FIG. 2 shows a block diagram of the correction unit 10 according to the exemplary embodiment. The correction unit 10 is described hereinbelow with reference to FIG. 2. Referring to FIG. 2, the correction unit 10 includes a data transfer unit 30, a correction direction determination unit 31, a correction bit generation unit 32 and a parallel-serial converter 33.

The data transfer unit 30 transfers data excluding at least one lower-order bit of the first digital input data Dina to a subsequent circuit. Specifically, the data transfer unit 30 includes the corresponding number of D flip-flops to the number of bits of data to be transferred. Then, the data transfer unit 30 holds the first digital input data Dina by the D flip-flops in synchronization with a correction circuit clock CLK that is output from another circuit. Although one lower-order bit of the first digital input data Dina is excluded from data to be transferred in the data transfer unit 30, the number of bits of data to be transferred by the data transfer unit 30 differs depending on how many lower-order bits of the first digital input data Dina are used as a target of correction by the correction unit 10.

The correction direction determination unit 31 manipulates at least one lower-order bit of the first digital input data Dina based on the correction direction designation signal contained in the control signal D_cal. In this exemplary embodiment, the correction direction determination unit 31 performs manipulation on one lower-order bit of the first digital input data Dina according to the correction direction designation signal. For example, if the correction direction designation signal has a value that indicates correction in the plus direction (e.g. 1), the correction direction determination unit 31 outputs data without inverting the value of the target bit. On the other hand, if the correction direction designation signal has a value that indicates correction in the minus direction (e.g. 0), the correction direction determination unit 31 outputs data after inverting the value of the target bit. Further, the correction direction determination unit 31 according to the exemplary embodiment performs manipulation on one lower-order bit when the lower-order bits excluding at least the most significant bit of the first digital input data Dina have the same value. Note that, how many lower-order bits of the first digital input data Dina are to be referred to as conditions for the correction direction determination unit 31 to perform manipulation on one lower-order bit can be set arbitrarily according to the number of first digital input data to be corrected.

In this exemplary embodiment, the correction direction determination unit 31 includes an AND circuit 40, a NAND circuit 41, multiplexers 42 and 43, and a D flip-flop. In this exemplary embodiment, correction is made on three pieces of data (e.g. data with a code of 1024, 2048 and 3072) in the first digital input data Dina. Thus, the AND circuit 40 refers to values of ten lower-order bits of the first digital input data Dina, and outputs High level (e.g. 1) when all values of the ten bits referred to become 1. Further, the NAND circuit 41 refers to values of ten lower-order bits of the first digital input data Dina, and outputs Low level (e.g. 0) when all values of the ten bits referred to become 1. The multiplexer 42 receives an output from the AND circuit 40 at one input terminal and receives an output from the NAND circuit 41 at another input terminal. The multiplexer 42 then selects and outputs either one of the output from the AND circuit 40 and the output from the NAND circuit 41 according to the correction direction designation signal. The multiplexer 43 receives data of one lower-order bit of the first digital input data Dina at one input terminal, and receives inverted data of one lower-order bit of the first digital input data Dina at another input terminal. The multiplexer 43 then outputs either one of the two input signals according to the output of the multiplexer 42. The D flip-flop temporarily stores the output of the multiplexer 43 according to the correction circuit clock CLK and outputs the stored value.

The correction bit generation unit 32 generates a correction bit to be added to the first digital input data Dina. Specifically, the correction bit generation unit 32 receives the correction bit contained in the control signal D_cal and, when the first digital input data Dina satisfies predetermined conditions, outputs the correction bit having a prescribed correction amount. On the other hand, when the first digital input data Dina does not satisfy predetermined conditions, the correction bit generation unit 32 outputs the correction bit with a correction amount of zero.

The correction bit generation unit 32 includes a NOR circuit 50, an AND circuit 51, an OR circuit 52, multiplexers 53 and 54, and a D flip-flop. In this exemplary embodiment, correction is made on three pieces of data (e.g. data with a code of 1024, 2048 and 3072) in the first digital input data Dina. Thus, the NOR circuit 50 refers to values of ten lower-order bits of the first digital input data Dina, and outputs High level (e.g. 1) when all values of the ten bits referred to become 0. Further, the AND circuit 51 refers to values of ten lower-order bits of the first digital input data Dina, and outputs High level (e.g. 1) when all values of the ten bits referred to become 1. The OR circuit 52 receives an output from the NOR circuit 50 and an output from the AND circuit 51, and outputs High level (e.g. 1) when either one of the output values becomes 1.

The multiplexer 53 receives correction data 0 and correction data 1 contained in the correction bit, and outputs either one of the correction data 0 and the correction data 1 according to the output of the OR circuit 52. The multiplexer 54 receives correction data 0 and correction data 2 contained in the correction bit, and outputs either one of the correction data 0 and the correction data 2 according to the output of the OR circuit 52. The correction data 0 indicates a value of the correction bit when correction is not made, and it is a value with a correction amount of zero in this exemplary embodiment. Further, the correction data 1 and the correction data 2 are treated as one data with a set of two bits, and a prescribed correction amount on the first digital input data Dina is given according to a value of the two bits. The D flip-flop temporarily stores the output of the multiplexers 53 and 54 according to the correction circuit clock CLK and outputs the stored value as the correction bit.

The parallel-serial converter 33 converts parallel data output from the data transfer unit 30, the correction direction determination unit 31 and the correction bit generation unit 32 into serial data. In this exemplary embodiment, the first digital input data Dina containing the correction bit is input as parallel data to the parallel-serial converter 33. Because the parallel data is 14 bits, the parallel-serial converter 33 outputs 14-bit serial data as the second digital input data Dinb. If the subsequent circuit is compatible with parallel data input, the parallel-serial converter 33 is not necessary.

Figure 3:
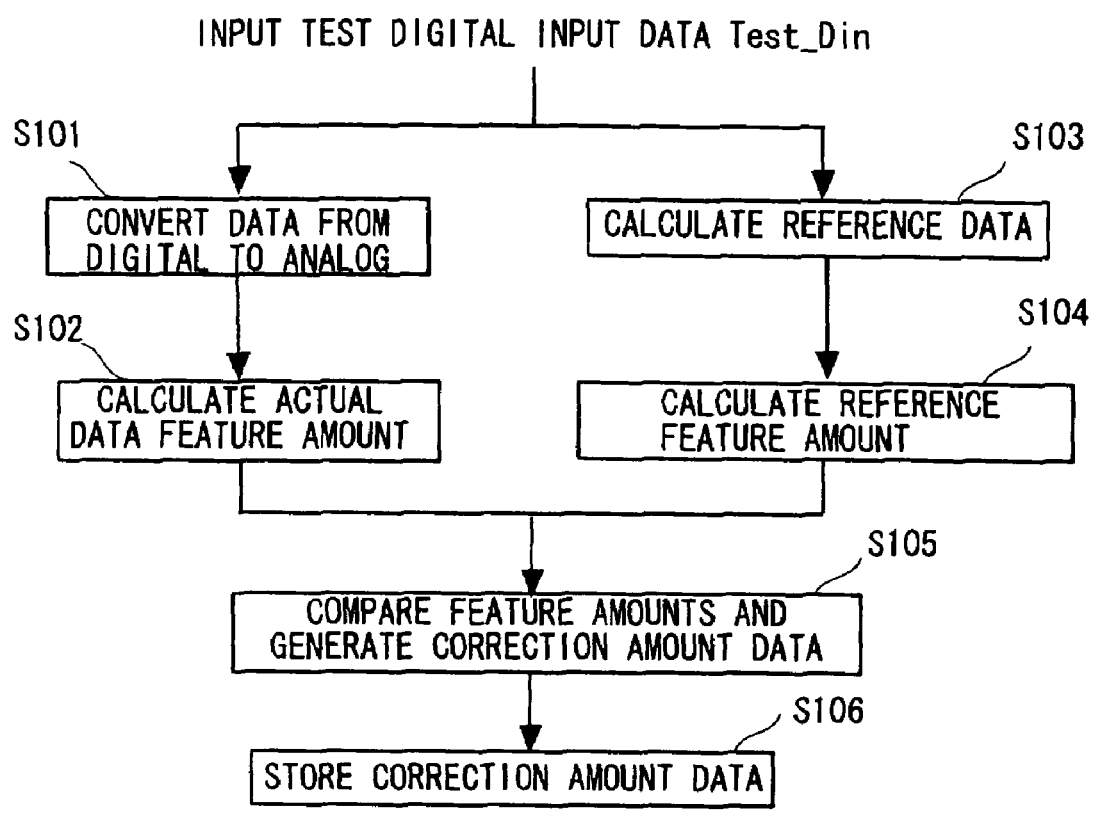
FIG. 3 is a flowchart showing a procedure to calculate correction data according to an exemplary embodiment.

A method of determining a value of the correction bit and a value of the correction direction designation signal according to the exemplary embodiment is described hereinafter. In this exemplary embodiment, a value of the correction bit and a value of the correction direction designation signal are determined by the calibration block 13. FIG. 3 shows a flowchart of correction data generation in the calibration block 13 according to the exemplary embodiment.

Referring to FIG. 3, in this exemplary embodiment, in order to determine a value of the correction bit and a value of the correction direction designation signal, test digital input data Test_Din is input to the conversion unit 11 of the DA converter 12, and test output Test_Aout is obtained (S101). Next, the test output Test_Aout obtained in the step S101 is input to the data computation unit 20, and actual data feature amount D_pr1 (e.g. actual measured value of DNL characteristics) corresponding to the test output Test_Aout is calculated (S102). Further, concurrently with the steps S101 and S102, test digital input data Test_Din is also input to the reference data storage unit 21, and reference data D_ref is output (S103). Then, the reference data D_ref obtained in the step S103 is input to the data computation unit 22, and reference feature amount D_pr2 (e.g. ideal value of DNL characteristics) corresponding to the test digital input data Test_Din is calculated (S104). In this exemplary embodiment, a plurality of successive digital values are input as the test digital input data, and a ramp wave is obtained as analog data. Then, the differential nonlinearity (DNL characteristics) of the ramp wave is calculated as the feature amount.

After that, the actual data feature amount D_pr1 and the reference feature amount D_pr2 obtained in the steps S102 and S104 are input to the data comparison unit 23, a value of correction amount data is calculated from a comparison result between those two values, and the value of correction amount data is output as a comparison result signal D_cmp (S105). Then, the correction amount data is stored into the correction value storage unit 24 based on the comparison result signal D_cmp obtained in the step S105 (S106). The correction value storage unit 24 outputs the control signal D_cal based on the correction amount data. The control signal D_cal contains the correction direction designation signal and the correction data.

Figure 4:
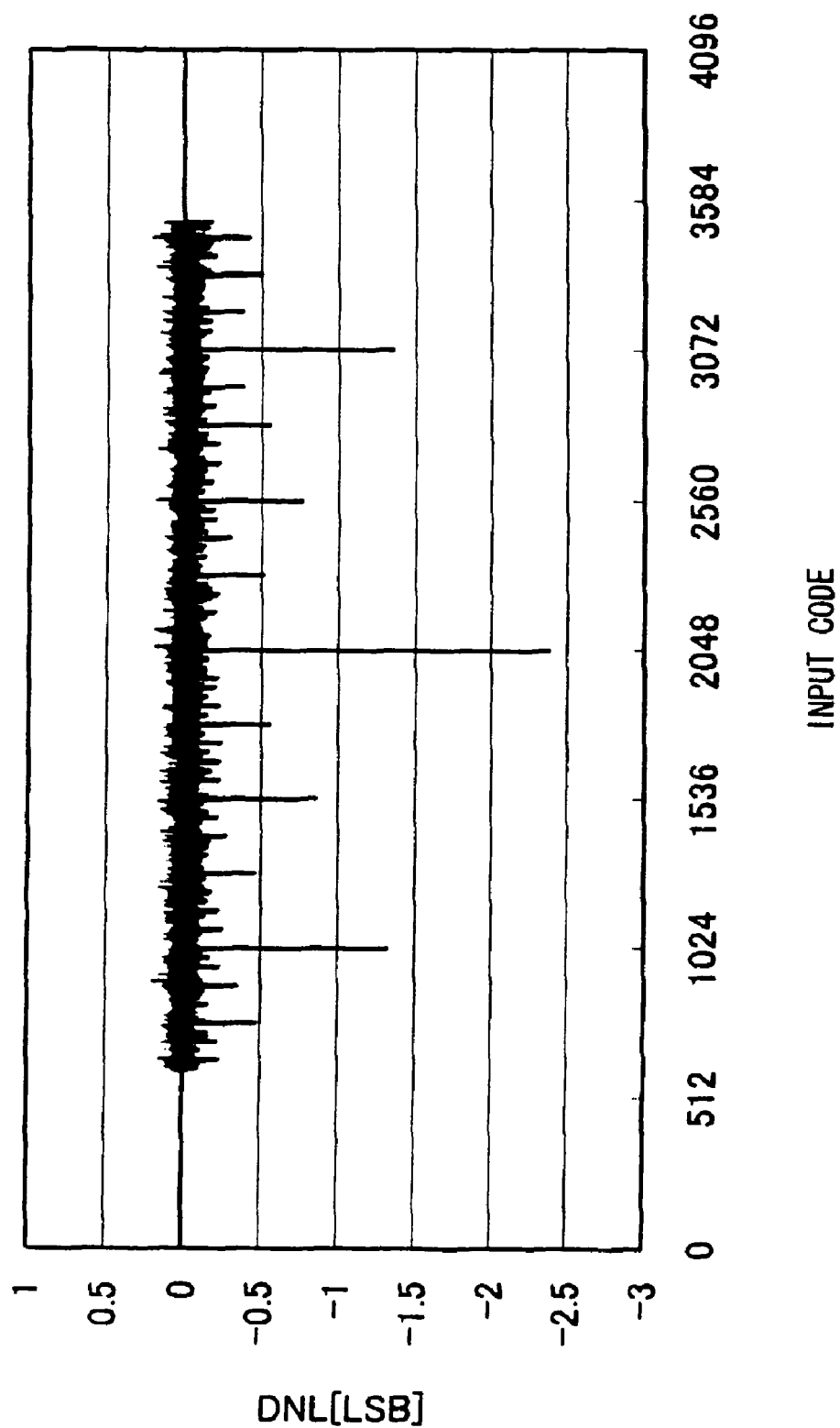
FIG. 4 is a graph showing DNL characteristics before performing correction in a digital-analog conversion circuit according to an exemplary embodiment.

A method of calculating correction amount data in the step S105 is described in further detail below. FIG. 4 shows a graph of DNL characteristics calculated in the step S102. In the graph shown in FIG. 4, the horizontal axis indicates a value of the code of test digital input data, and the vertical axis indicates a DNL error. As shown in FIG. 4, if no correction is made in the correction unit 10, the characteristics are degraded particularly at points with a code of 1024, 2048 and 3072 in the test output Test_Aout that is output form the conversion unit 11. Further, the DNL characteristics are degraded to the minus regardless of the value of the code.

FIGS. 5A and 5B are waveform charts showing the relationship between input and output of the DA converter 12 at the point near the code 2048. In FIGS. 5A and 5B, the horizontal axis indicates a code of the first digital input data Dina, and the vertical axis indicates a value of analog data. FIG. 5A is a waveform chart when the first digital input data Dina is input, and no correction is made to the first digital input data Dina. FIG. 5B is a waveform chart when the first digital input data Dina is input, and correction is made to the first digital input data Dina.

As shown in FIG. 5A, when the code changes from 2047 to 2048, the most significant bit and the other bits are inverted in the first digital input data Dina used in this exemplary embodiment. At the point when the value of the most significant bit is switched, DNL characteristics of analog data are degraded in the conversion unit 11 according to the exemplary embodiment.

In light of this, in this exemplary embodiment, a value of the correction bit to be added to the first digital input data Dina when the first digital input data Dina around the point at which degradation of DNL characteristics occurs is determined based on the correction amount data calculated in the step S104. Further, whether to correct the value of the first digital input data Dina in either the plus direction or the minus direction based on the value of the correction bit is controlled by manipulating the least significant bit of the first digital input data Dina.

Specifically, in this exemplary embodiment, the value of the correction direction designation signal is set to 0, and the values of the correction data 1 and 2 are set to 1 and 0, respectively. By giving such values as the control signal D_cal, when the first digital input data Dina indicates 011111111111, 01111111111010 is output as the second digital input data Dinb as shown in FIG. 5B. Further, when the first digital input data Dina indicates 100000000000, 10000000000010 is output as the second digital input data Dinb.

Thus, in this exemplary embodiment, the value of the second digital input data Dinb after correction is set to be larger or smaller than the value of the second digital input data Dinb before correction (with a value of 01111111111100) in accordance with the direction of degradation of DNL characteristics. By making such correction, the analog data Aout increases monotonically with respect to the first digital input data, and DNL characteristics are improved. Further, in this exemplary embodiment, whether to correct the value of the first digital input data Dina is determined by referring to the values of ten lower-order bits of the 12-bit first digital input data Dina. Therefore, the above-described correction processing is performed at the three points (e.g. with a code of 1024, 2048 and 3072) at which the values of two high-order bits are switched.

Figure 6:
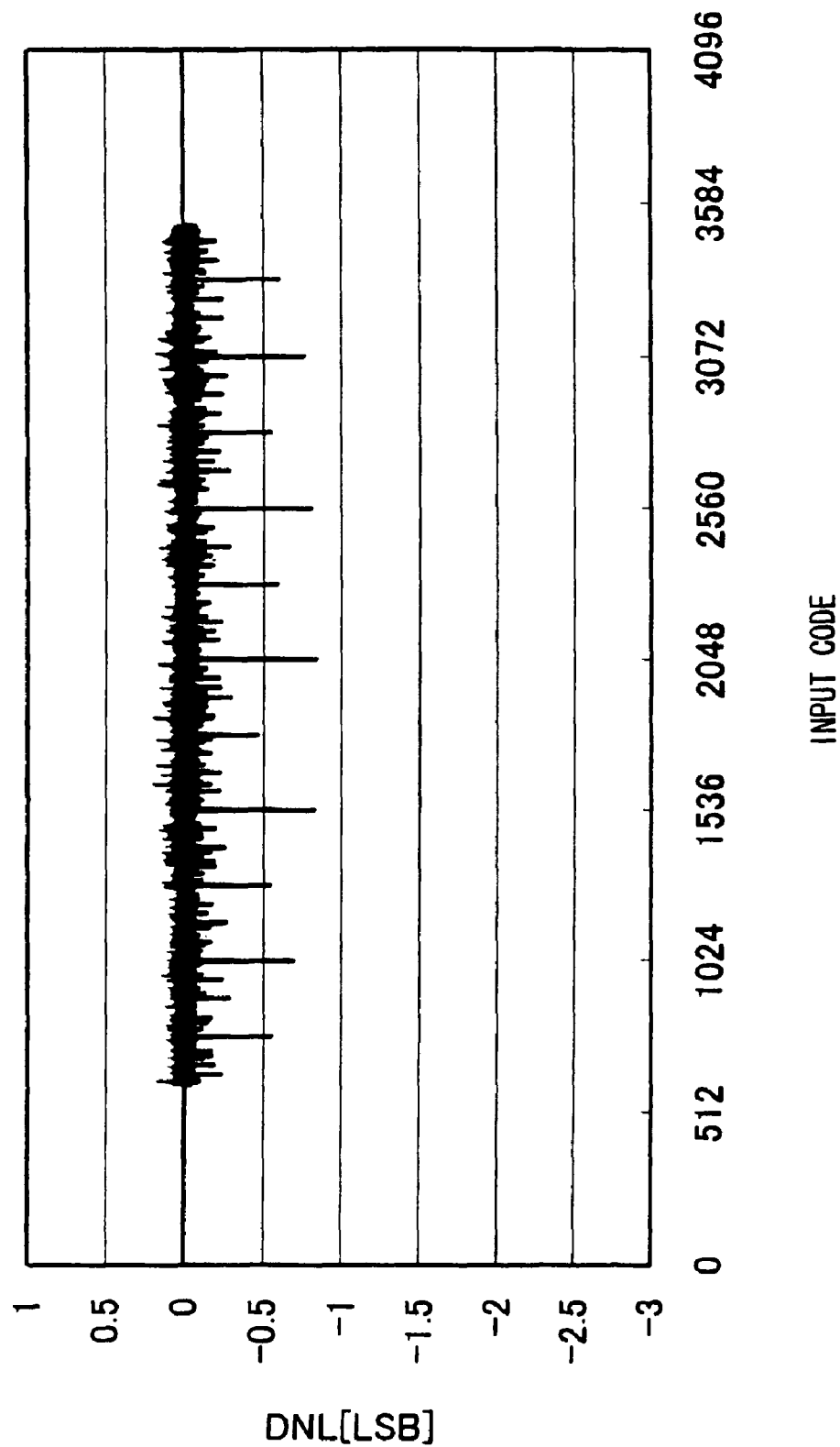
FIG. 6 is a graph showing DNL characteristics after performing correction in a digital-analog conversion circuit according to an exemplary embodiment.
Figure 7:
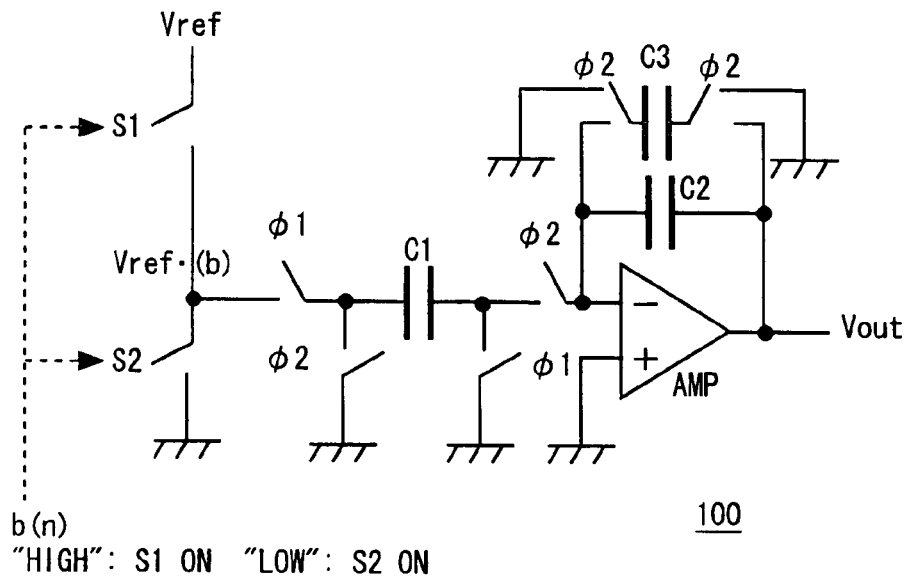
FIG. 7 is a block diagram of a conversion unit in a general cyclic digital-analog conversion circuit.
Figure 8:
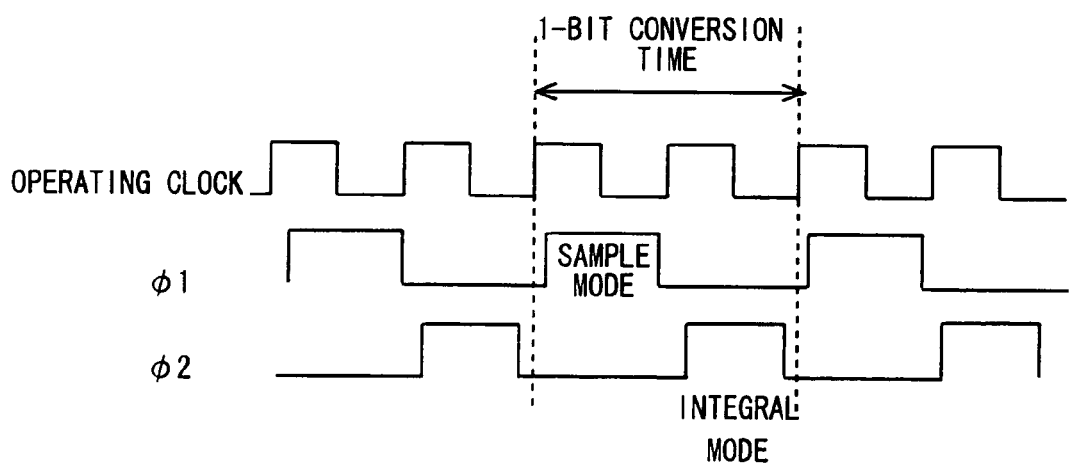
FIG. 8 is a timing chart of a control signal supplied to a general cyclic digital-analog conversion circuit.
Figure 9B:
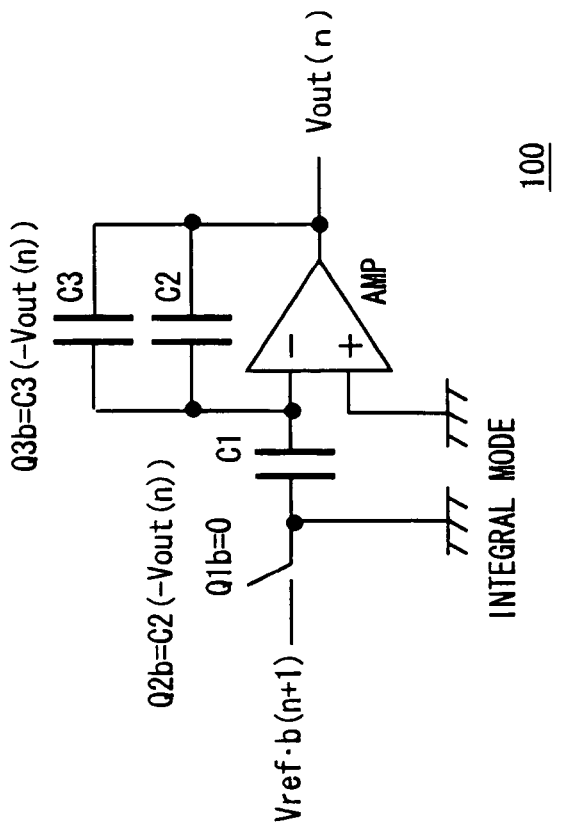
FIGS. 9A and 9B are circuit diagrams to describe conversion operation in a general cyclic digital-analog conversion circuit.
Figure 9A:
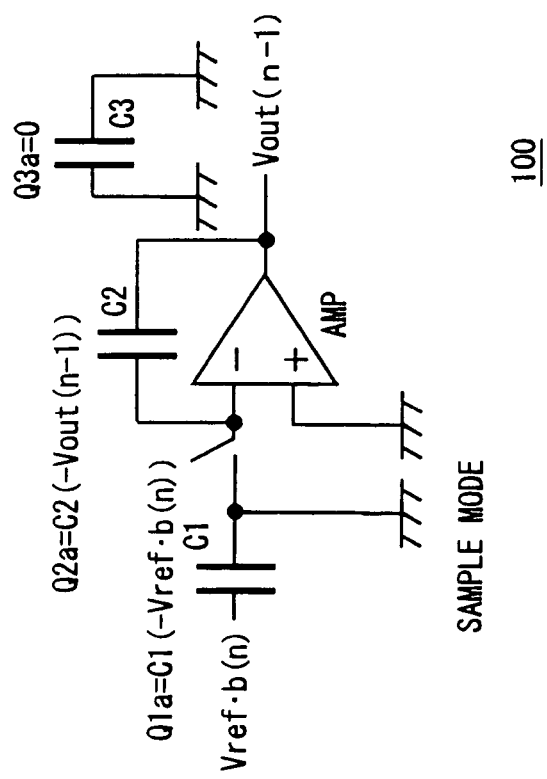

FIG. 6 shows a graph of DNL characteristics when correction of the first digital input data Dina is performed in the digital-analog conversion circuit 1 according to the exemplary embodiment. In the graph of FIG. 6, the correction method according to the exemplary embodiment is applied the case where the DNL characteristics shown in FIG. 4 is an initial state. As shown in FIG. 6, by applying the correction method according to the exemplary embodiment, the DNL characteristics at the points with a code of 1024, 2048 and 3072 are significantly improved.

As described above, in the digital-analog conversion circuit 1 according to the exemplary embodiment, DNL characteristics of analog data are improved by making correction to digital input data to be input to the conversion unit 11 that converts digital input data into analog data. This eliminates the need to make any change for correction to the conversion unit 11. Therefore, in the digital-analog conversion circuit 1 according to the exemplary embodiment, there is no need to add a capacitor that occupies a large circuit area to the conversion unit 11, thereby suppressing an increase in circuit area that related to improvement of conversion characteristics. In this exemplary embodiment, the correction unit 10 corrects the first digital input data Dina and generates the second digital input data Dinb, and the correction unit 10 may be configured by a simple logic circuit as shown in FIG. 2. The logic circuit has a significantly smaller circuit occupation area than a capacitor. Accordingly, an increase in circuit area due to addition of the correction unit 10 is significantly smaller than an increase in circuit area when adding a capacitor.

Further, in the digital-analog conversion circuit 1 according to the exemplary embodiment, the correction bit is added to the lower-order bit of the first digital input data Dina, and the value of the correction bit is changed according to the previously calculated correction amount upon change in the higher-order bit. Correction of analog data with use of the second digital input data Dinb generated in this manner is particularly effective when a cyclic digital-analog conversion circuit is used for the conversion unit 11. In the cyclic digital-analog conversion circuit, a change in the higher-order bit has a significant effect on a conversion result as shown in the expression (9) described above. Thus, by making correction to the first digital input data Dina with the correction bit upon change in the higher-order bit when a conversion error increases, a high correction effect can be obtained. This is obvious from the graphs of DNL characteristics shown in FIGS. 4 and 6.

Further, in this exemplary embodiment, ten lower-order bits of the 12-bit first digital input data Dina are monitored to determine whether to make correction to the first digital input data Dina. Further, data of the correction amount is supplied as the correction data 1 and 2 in a fixed manner by the control signal D_cal. Furthermore, degradation of DNL characteristics tends to be one-sided in one direction (e.g. plus direction or minus direction) when a cyclic digital-analog conversion circuit is used as the conversion unit 11. Therefore, the value of the correction direction designation signal contained in the control signal D_cal can be also supplied in a fixed manner. This eliminates the need to change the control signal D_cal according to the first digital input data Dina during normal operation, thereby achieving higher-speed operation in the digital-analog conversion circuit 1 according to the exemplary embodiment.

Further, the cyclic digital-analog conversion circuit performs conversion processing based on an operating clock, and the frequency of the operating clock is normally set to be higher than the frequency of the first digital input data Dina. Accordingly, although the number of bits of the second digital input data Dinb which is input to the conversion unit 11 is larger than the number of bits of the first digital input data Dina, because the correction bit that is added to the first digital input data Dina has a small number of bits, processing can be performed within the allowable range of operation of the conversion unit 11 without setting a higher frequency of the operating clock in this exemplary embodiment.

Further, although the parallel-serial converter 33 is placed on the output side of the correction unit 10 because a cyclic digital-analog conversion circuit is used as the conversion unit 11 in the above-described exemplary embodiment, if the conversion unit 11 is a conversion circuit that receives parallel data as input data, the parallel-serial converter 33 is not necessary. Therefore, the correction unit 10 according to the exemplary embodiment can correct an output result for a conversion circuit different from a cyclic digital-analog conversion circuit. Hence, the correction unit 10 can make correction on any input data by supplying the control signal D_cal to be applied to the correction unit 10 for input data where degradation of DNL characteristics of an output result occurs.

Further, although the number of correction bits is two in the exemplary embodiment, the number of correction bits may be larger than two. By increasing the number of correction bits, adjustment steps of the correction amount becomes finer. However, the correction effect of DNL characteristics is not largely improved even if the number of correction bits is set to be four or more. Furthermore, in order to increase the number of correction bits, it is necessary to increase the number of circuits of the correction bit generation unit 32. In view of this, it is possible to suppress an increase in circuit area with respect to the correction result by setting the number of correction bits to be two or three.

Further, in the digital-analog conversion circuit according to the exemplary embodiment, a value of the correction bit and a value of the correction direction designation signal are determined by calibration operation that is performed prior to start of operation of the digital-analog conversion circuit. It is thereby possible to calculate a value of the correction bit and a value of the correction direction designation signal corresponding to the digital-analog conversion circuit even when the digital-analog conversion circuit has any variation.

In the technique disclosed in Japanese Unexamined Patent Application Publication No. 63-42523, the capacitance of a tuning capacitor is substantially equal to the capacitance of a parasitic capacitor, and it is necessary to accurately detect a small capacitance mismatch. Thus, the correction accuracy of relative variation is limited by the accuracy of a detector (e.g. a voltage comparator) in some cases. In such a case, the technique disclosed in Japanese Unexamined Patent Application Publication No. 63-42523 has a problem that it fails to make sufficient correction. On the other hand, because the digital-analog conversion circuit 1 according to the exemplary embodiment does not make any change to the conversion unit 11, such a problem does not occur. Further, the technique disclosed in Japanese Unexamined Patent Application Publication No. 2007-235379 has a problem that a switch control sequence for controlling an added capacitor becomes complicated. On the other hand, because a switch control sequence other than switch control for normal conversion operation is not necessary for switching of capacitors in the digital-analog conversion circuit 1 according to the exemplary embodiment, such a problem does not occur.

The present invention is not limited to the above-described exemplary embodiment, and various changes may be made without departing from the scope of the invention. For example, if the first digital input data Dina is input as serial data, the correction unit 10 can operate by placing a serial-parallel converter on the input side of the correction unit 10 and supplying parallel data to the data transfer unit 30 and the correction direction determination unit 31 of the correction unit 10.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A digital-analog conversion circuit comprising:
    a correction unit that adds a correction bit to a lower-order bit of externally input first digital input data and outputs second digital input data; and
    a conversion unit that receives the second digital input data and outputs an analog value,
    wherein the correction unit generates the second digital input data by manipulating data of a lower-order bit of the second digital input data around a point where an error between the analog value and an expected value set for the first digital input data becomes greater than a preset value.

2. The digital-analog conversion circuit according to claim 1, wherein a difference between the second digital input data and the first digital input data corresponding to the second digital input data is less than a minimum change step of the first digital input data.

3. The digital-analog conversion circuit according to claim 1, wherein the correction unit determines a correction direction by manipulating data of at least one lower-order bit of the first digital input data and determines a correction amount based on a value of the correction bit.

4. The digital-analog conversion circuit according to claim 1, wherein the correction unit manipulates the second digital input data around a point of change in a value of at least one higher-order bit of the first digital input data.

5. The digital-analog conversion circuit according to claim 1, wherein the correction unit comprises:
    an input data transfer unit that transfers data excluding at least one lower-order bit of the first digital input data;
    a correction direction determination unit that manipulates a value of at least one lower-order bit of the first digital input data based on a correction direction designation signal; and
    a correction bit generation unit that generates a correction bit corresponding to the first digital input data.

6. The digital-analog conversion circuit according to claim 5, wherein the correction bit generation unit outputs the correction bit having a preset correction amount when the first digital input data satisfies a predetermined condition, and outputs the correction bit with the correction amount of zero when the first digital input data does not satisfy the predetermined condition.

7. The digital-analog conversion circuit according to claim 6, wherein the correction direction determination unit manipulates and outputs data of at least one lower-order bit of the first digital input data based on the correction direction designation signal when the first digital input data satisfies the predetermined condition, and outputs data without manipulating the first digital input data when the first digital input data does not satisfy the predetermined condition.

8. The digital-analog conversion circuit according to claim 6, wherein the predetermined condition is that all values of the first digital input data excluding at least one higher-order bit are the same.

9. The digital-analog conversion circuit according to claim 1, further comprising:
    a correction value storage unit that stores a correction direction value indicating a correction direction corresponding to the first digital input data and a correction value indicated by the correction bit corresponding to the first digital input data.

10. The digital-analog conversion circuit according to claim 1, wherein the correction bit is two-bit or three-bit data.

11. The digital-analog conversion circuit according to claim 1, wherein the conversion unit comprises a cyclic digital-analog conversion circuit.

12. The digital-analog conversion circuit according to claim 11, wherein:
the first digital input data comprises a parallel signal,
the second digital input data comprises a serial signal, and
the correction unit includes a parallel-serial converter that is placed at an output end and converts the parallel signal into the serial signal.

13. The digital-analog conversion circuit according to claim 11, wherein:
the first digital input data comprises a serial signal,
the second digital input data comprises a serial signal, and
the correction unit includes:
a serial-parallel converter that is placed at an input end and converts the serial signal into a parallel signal, and
a parallel-serial converter that is placed at an output end and converts the parallel signal into the serial signal.

14. An output data correction method in a digital-analog conversion circuit that converts first digital input data into analog output data, the method comprising:
calculating a correction amount based on an error between the analog output data and an expected value set for the first digital input data;
generating second digital input data by adding a correction bit having a value based on the correction amount to a lower-order bit of the first digital input data; and
converting the second digital input data and obtaining the analog output data,
wherein the correction bit having a value based on the correction amount is added to the second digital input data around a point of change in a value of at least one higher-order bit of the first digital input data.

15. The output data correction method in a digital-analog conversion circuit according to claim 14, wherein a correction direction for the first digital input data is determined by manipulating a value of at least one lower-order bit of data corresponding to the first digital input data contained in the second digital input data.

16. The output data correction method in a digital-analog conversion circuit according to claim 14, wherein the correction bit comprises two-bit or three-bit data.

17. The output data correction method in a digital-analog conversion circuit according to claim 14, wherein the digital-analog conversion circuit comprises a cyclic digital-analog conversion circuit.

18. An output data correction method in a digital-analog conversion circuit that converts first digital input data into analog output data, the method comprising:
calculating a correction amount based on an error between the analog output data and an expected value set for the first digital input data;
generating second digital input data by adding a correction bit having a value based on the correction amount to a lower-order bit of the first digital input data; and
converting the second digital input data and obtaining the analog output data, wherein the generating of the second digital input data comprises manipulating data of the lower-order bit of the second digital input data around a point where the error between the analog value and the expected value set for the first digital input data becomes greater than a preset value.

19. The output data correction method according to claim 14, wherein the generating of the second digital input data comprises adding the correction bit when the error is greater than a predetermined reference value.

* * * * *